| United States Patent [19] | [11] Patent Number: 4,910,564 |
|---|---|
| Inoue | [45] Date of Patent: Mar. 20, 1990 |

[54] HIGHLY INTEGRATED FIELD EFFECT TRANSISTOR AND METHOD FOR MANUFACTURING THE SAME

[75] Inventor: Yasuo Inoue, Hyogo, Japan

[73] Assignee: Mitsubishi Denki Kabushiki Kaisha, Tokyo, Japan

[21] Appl. No.: 213,493

[22] Filed: Jun. 30, 1988

[30] Foreign Application Priority Data

Jul. 1, 1987 [JP] Japan ................................ 62-164427
Jul. 28, 1987 [JP] Japan ................................ 62-189376

[51] Int. Cl.⁴ .......................................... H01L 29/78
[52] U.S. Cl. ................................... 357/23.4; 357/55; 357/42; 357/49
[58] Field of Search ..................... 357/23.4, 55, 42, 49

[56] References Cited

U.S. PATENT DOCUMENTS

| 4,663,644 | 5/1987 | Shimizu | 357/23.4 |
| 4,670,768 | 6/1987 | Sunami | 357/23.4 |

FOREIGN PATENT DOCUMENTS 8110451 12/1981 European Pat. Off. .
54-151380 11/1979 Japan .................................. 357/23.4

Primary Examiner—Andrew J. James
Assistant Examiner—David Soltz
Attorney, Agent, or Firm—Lowe, Price, LeBlanc, Becker & Shur

[57] ABSTRACT

A field effect transistor has its channel region and source - drain regions extending in a direction approximately vertical to a main surface of a substrate. The field effect transistor may be a complementary type in which p type and n type transistors are formed as a pair. The channel region and the source drain regions may be placed side by side in the direction of the main surface of the substrate or they may be placed side by side in the direction of the depth of the substrate. In such transistors, each of the regions is formed by stepup implantation carried out by stepup voltage of the corresponding ion beam.

10 Claims, 12 Drawing Sheets

HIGHLY INTEGRATED FIELD EFFECT TRANSISTOR AND METHOD FOR MANUFACTURING THE SAME

BACKGROUND OF THE INVENTION

1. Field of the Invention

The present invention relates generally to a field effect transistor and, more specifically, to a highly integrated field effect transistor in which a channel region formed between a drain and a source is opposed to a gate.

2. Description of the Prior Art

FIG. 1 is a schematic diagram showing a silicon gate type n channel MOSFET which is an example of a conventional field effect transistor.

Referring to FIG. 1, in this MOSFET 1, n type impurities are diffused in a p type silicon substrate 2 to form a drain 3 and a source 4. A gate 6 formed of polycrystalline silicon is provided above the channel region 5 formed between the drain 3 and the source 4 with a gate oxide film, not shown, interposed therebetween. Other oxide films, Al wiring and the like are omitted in FIG. 1.

Such MOSFET 1 can be obtained by manufacturing methods such as follows. Namely, (1) n type impurities are doped with a prescribed mask disposed on a main surface 2a of a substrate 2 to form the drain 3 and the source 4, and thereafter, a polycrystalline silicon is provided above the channel region 5 as the gate 6, or (2) a polycrystalline silicon is provided as the gate 6 above the position on which the channel region 5 should be formed, and thereafter, n type impurities are doped with the gate 6 serving as a mask to form the drain 3 and the source 4 by self-alignment.

In the MOSFET 1 having the above described structure, a current flows between the drain 3 and the source 4 through an inverted layer (not shown) generated in the channel region 5 by the voltage applied between the gate 6 and the source 4. The current is controlled by the magnitude of the voltage applied between the gate 6 and the source 4.

According to the conventional MOSFET 1 as described above, the channel surface 5a opposed to the gate 6 for defining the extension of the flow path of the carrier in the channel region 5 is formed in parallel to the main surface 2a of the substrate 2. Therefore, the area $S_1$ required for forming one MOSFET 1 will be at least approximately:

$$S_1 = (L_C + L_D + L_S) \times D_1 \qquad (1)$$

In the equation (1), $L_C$ denotes channel length, $L_D$ and $L_S$ denote length of the drain 3 and of the source 4, respectively, and $D_1$ denotes channel width.

Therefore, in order to get higher integration of the MOSFET 1 on the substrate 2, the MOSFET 1 itself should be made compact by reducing the channel length $L_C$, the length $L_D$ and $L_S$ of the drain 3 and the source 4, respectively and the channel width $D_1$ of each MOSFET 1.

However, the higher integration has difficult problems. Namely, a higher technique of fine processing is required to make compact the MOSFET 1. In addition, in order to maintain the electrical characteristics of the MOSFET 1, the $L_C$, $L_D$, $L_S$ and $D_1$ can not be made very small. These problems are common to all field effect transistors, not only to the MOSFET 1.

Meanwhile, a DRAM cell comprising a trench, a capacitor formed in a lower portion of the trench and a transistor formed in a upper portion of the trench is disclosed in "Technical Digest of International Electron Device Meeting", 1979, Washington D.C., pp. 714–717. However, this structure is also insufficient to improve the degree of integration.

SUMMARY OF THE INVENTION

An object of the present invention is to provide a field effect transistor which can be highly integrated without making compact the field effect transistor itself.

Another object of the present invention is to provide a method for manufacturing such a field effect transistor.

A further object of the present invention is to enable higher integration of a complementary field effect transistor.

A still further object of the present invention is to provide a method for manufacturing such a complementary field effect transistor.

In a first aspect of the present invention, a field effect transistor comprises a substrate; a channel region formed in the substrate and having a channel surface defining a width of a flow path of carriers; a pair of source.drain regions formed in the substrate on both sides of the channel region; and a gate region formed opposed to the channel region in the substrate. The channel surface and the source.drain regions are formed extending in a direction crossing the main surface of the substrate.

In a method according to a second aspect of the present invention, at first a substrate is prepared. Thereafter, a channel region is formed in the substrate, the region extending in a direction crossing the main surface of the substrate and having a channel surface defining the width of a flow path of carriers.

Thereafter, a gate region is formed in the substrate which is opposed to and spaced apart from the channel surface and extended in the direction crossing the main surface of the substrate. Finally, a pair of source.drain regions is formed in the substrate on opposite sides of the channel region so as to extend with respect thereto in the direction crossing the main surface of the substrate.

In the third aspect of the present invention, at first a substrate is prepared. A first source.drain region, a channel region and a second source.drain region are formed in this order from the position apart from the main surface to the position near the main surface in the said substrate. Thereafter, a gate region is formed in the substrate which is opposed to and spaced apart from the channel region and the said source.drain regions and extended in the direction crossing the main surface of the said substrate.

In the fourth aspect of the present invention, a field effect transistor comprises a semiconductor substrate having a main surface; an n channel transistor formed in the semiconductor substrate; and a p channel transistor formed in the semiconductor substrate and arranged opposed to the n channel transistor. Each of the transistors has a pair of source.drain regions, a channel region arranged therebetween, and a gate region arranged spaced apart from the channel region. Each of the channel regions has a channel surface defining the width of a flow path of carriers. The channel surface are approximately parallel to each other and approximately vertical to the main surface of the substrate. The gate region is arranged between both the transistors and is approximately vertical to the main surface of the substrate.

In a method as the fifth aspect of the present invention, at first a substrate is prepared. Thereafter, two channel regions extending in the direction crossing the main surface of the substrate and spaced apart from each other are formed in the substrate. Two pairs of source.drain regions extending in the direction crossing the main surface of the substrate and sandwiching the channel regions respectively are formed in the substrate. Thereafter, a gate region common to both transistors is formed between and spaced apart from the channel regions.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 3Ab to 3Hb are cross sectional views taken along the line X—X of FIGS. 3Aa to 3Ha, respectively;

FIGS. 7Ab to 7Jb are cross sectional views taken along the line Y—Y of FIGS. 7Aa to 7Ja, respectively;

DESCRIPTION OF THE PREFERRED EMBODIMENTS

Embodiment 1

Figure 2:
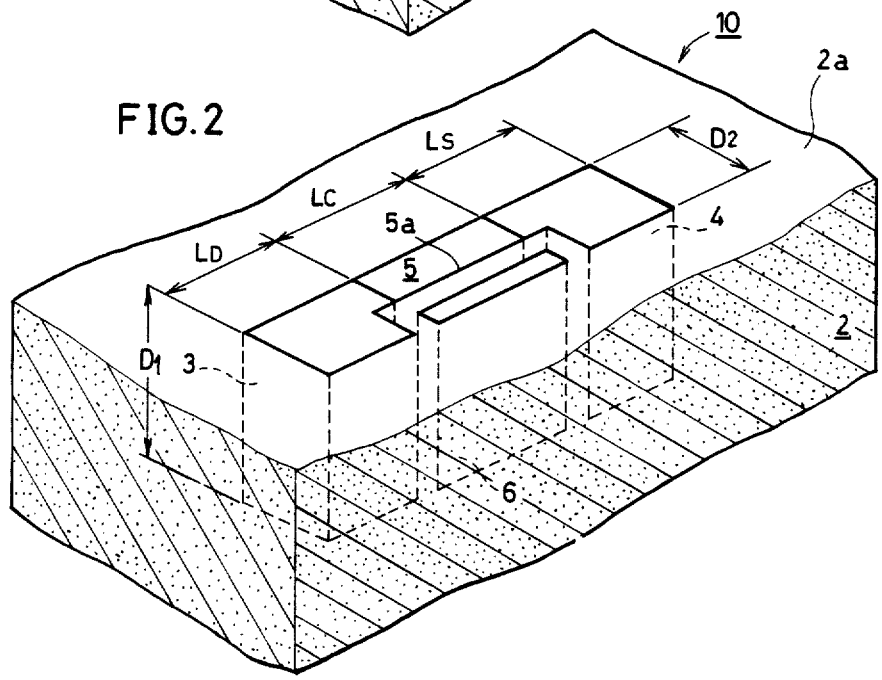
FIG. 2 is a schematic diagram showing a silicon gate type n channel MOSFET which is the first embodiment of the present invention.

FIG. 2 is a schematic diagram showing a silicon gate type n channel MOSFET which is the first embodiment of the present invention.

Referring to FIG. 2, in the MOSFET 1, n type impurities are diffused in a p type silicon substrate 2 to form a drain 3 and a source 4. A channel region 5 is formed between the drain 3 and the source 4. A gate 6 formed of polycrystalline silicon is provided adjacent to the channel region 5, with a gate oxide film (not shown) interposed therebetween. Other oxide films, Al wiring and the like are omitted in FIG. 2.

In FIG. 2, a channel surface 5a to define the width of a flow path of carriers in the channel region 5 is formed opposed to the gate 6 in a direction vertical to the main surface 2a of the substrate. The gate 6 extends also in the direction vertical to the main surface 2a. Correspondingly, the drain 3 and the source 4 are also vertical to the main surface 2a, extending in the direction of the depth of the substrate 2.

In this first embodiment, on the channel surface 5a of the channel region 5 vertical to the main surface 2a, the direction of the channel length $L_C$ is defined parallel to the main surface 2a.

In the MOSFET 1 as described above, a current flows between the drain 3 and the source 4 through an inverted layer (not shown) as a passage generated in the channel region 5 by a voltage applied between the gate 6 and the source 4. The current depends on the magnitude of the voltage applied between the gate 6 and the source 4.

Figure 3A:
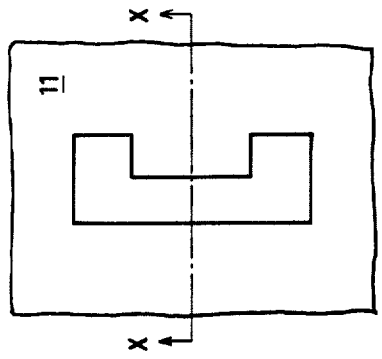
FIGS. 3Aa to 3Ha are plan views showing manufacturing process of the MOSFET shown in FIG. 2.
Figure 3A:
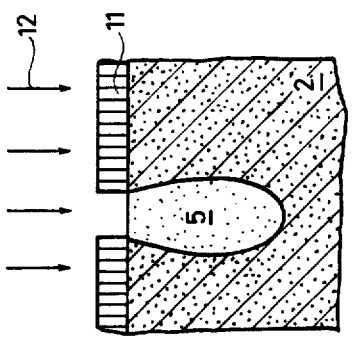

The method for manufacturing the above MOSFET 10 will be described in the following. FIGS. 3Aa to 3Hb are plan views and cross sectional views taken along the line X—X showing the manufacturing process of the MOSFET 10.

First, as shown in FIGS. 3Aa and 3Ab boron is implanted in a portion of a p type substrate 2 in which the drain 3, source 4 and the channel region 5 should be formed, using a resist 11 applied on the substrate 2 as a mask. The boron controls the threshold voltage of the MOSFET 10 to be a prescribed value. In the boron implantation, the accelerating voltage of the boron ion beam 12 is stepped up in order to control the distribution of boron in the depth direction (this implantation will be called the stepup implantation in the following description).

Figure 3B:
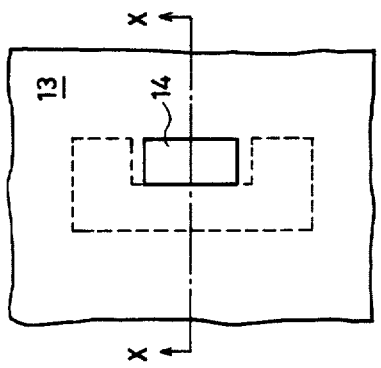
Figure 3B:
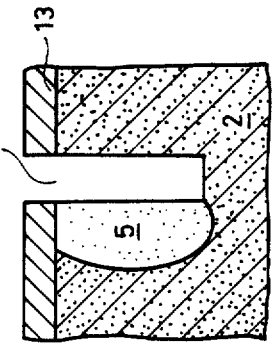
Figure 3C:
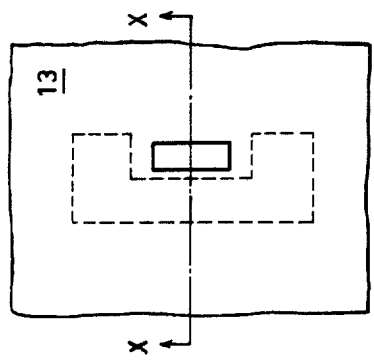
Figure 3C:
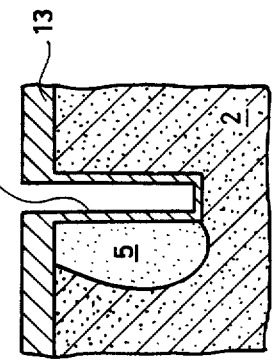

Thereafter, the resist 11 is removed, a silicon oxide film 13 is formed on the upper surface or main surface of the substrate 2, and a portion of the substrate 2 in which the gate 6 should be formed is selectively etched to form a trench 14 (FIGS. 3Ba and 3Bb). On this occasion, the position of the trench 14 is determined such that the trench 14 bares the channel region 5. After the trench 14 is formed, a silicon oxide film 15 is formed on the inner surface of the trench 14 (FIGS. 3Ca and 3Cb). A portion of the silicon oxide film 15 which is formed on the side of the channel region 5 will be the gate oxide film of the MOSFET 10.

Figure 3D:
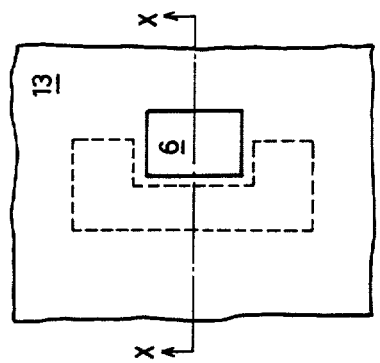
Figure 3D:
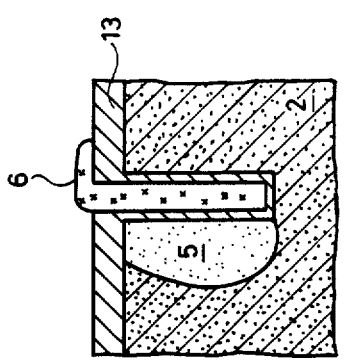

Thereafter, a doped polysilicon is deposited on the upper surface of the substrate 2 (including the inside of the trench 14) by the CVD method, and selective patterning is carried out by lithography to form the gate 6, as shown in FIGS. 3D. The doped polysilicon filled into the trench 14 is to be the gate 6. Thereafter, the upper surface of the substrate 2 is masked with a resist 16 and stepup implantation of arsenic is carried out in the portions which are to be the drain 3 and the source 4 (FIGS. 3E).

In this embodiment, the drain 3 and the source 4 must be formed in a relatively deep position. Therefore, the extension of the implanted arsenic in the transverse direction (especially in the direction to the channel region 5) must be controlled so as not to damage the electrical characteristics of the MOSFET 10. This control can be carried out by the stepup implantation in consideration of the relation of the extension of the arsenic in the transverse direction and the depth of implantation to the stepup voltage of the arsenic ion beam, which is experimentally studied beforehand.

Figure 3E:
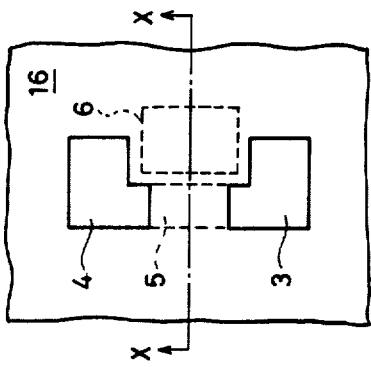
Figure 3E:
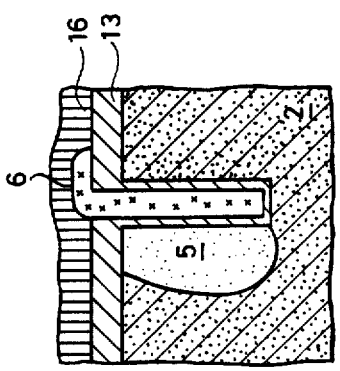
Figure 3F:
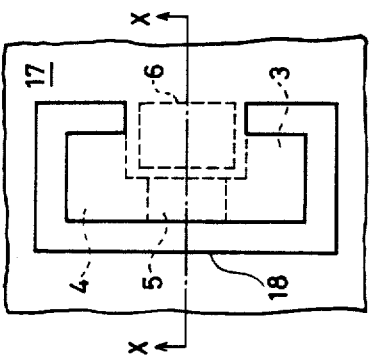
Figure 3F:
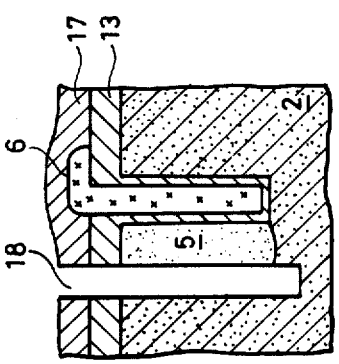
Figure 3G:
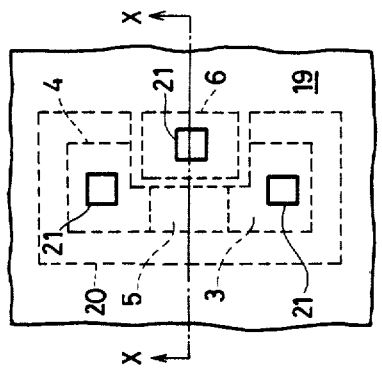
Figure 3G:
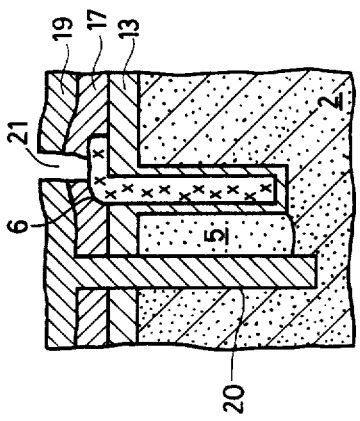
Figure 3H:
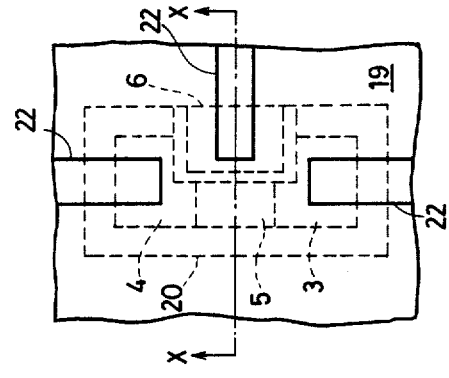
Figure 3H:
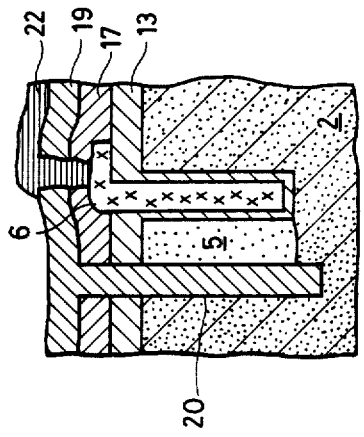

After the resist 16 of FIGS. 3E is removed, a silicon oxide film 17 is formed and selective etching is carried out on the surroundings of the drain 3, source 4 and the channel region 5 to form a trench 18 for isolating elements (FIGS. 3F). Thereafter, a silicon oxide film 19 is formed in the trench 18 as well as on the film 17 by thermal oxidation or CVD method (FIGS. 3G). The silicon oxide film 19 formed in the trench 18, thus, forms the isolating region 20. Contact holes 21 are formed respectively above the drain 3, source 4 and the gate 6 by lithography. Further, aluminum wirings 22 are provided through each of the contact holes 21 (FIGS. 3H) and a protecting film (not shown) is applied thereon.

The MOSFET 10 shown in FIG. 2 is provided by the above described manufacturing method.

Figure 1:
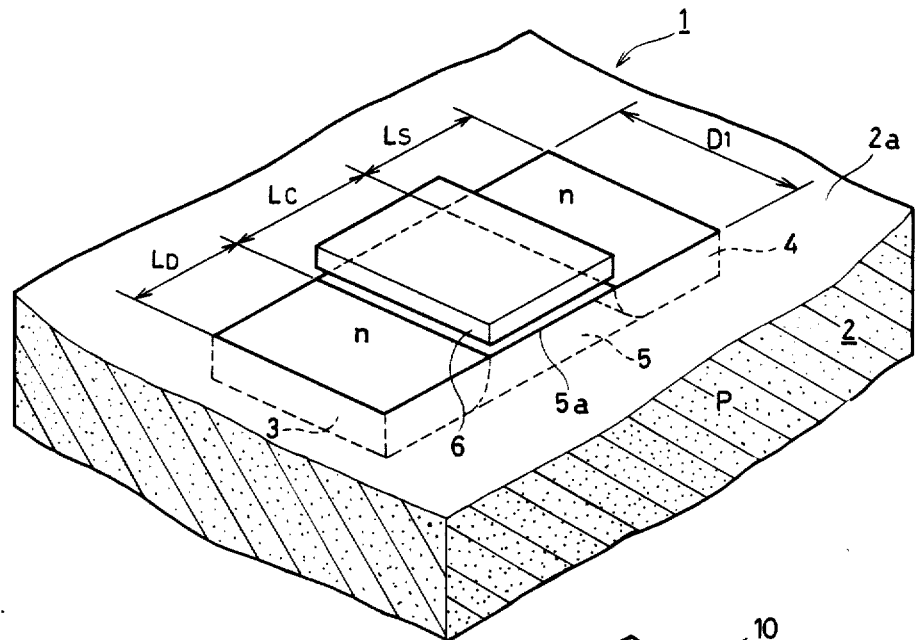
FIG. 1 is a schematic diagram of the prior art.

The area $S_2$ required for forming the MOSFET 10 can be approximately calculated by $$S_2 = (L_C + L_D + L_S) \times D_2 \tag{2}$$

where $D_2$ is the width of the source 3 and the drain 4 on the main surface 2a (FIG. 2). The width $D_2$ in the equation (2) is considerably smaller than the channel width $D_1$ of the equation (1). Therefore, the area $S_2$ on the main surface 2a of the substrate 2 which is occupied by the MOSFET 10 is considerably smaller than the area of the conventional MOSFET 1 (FIG. 1).

Embodiment 2

Figure 4:
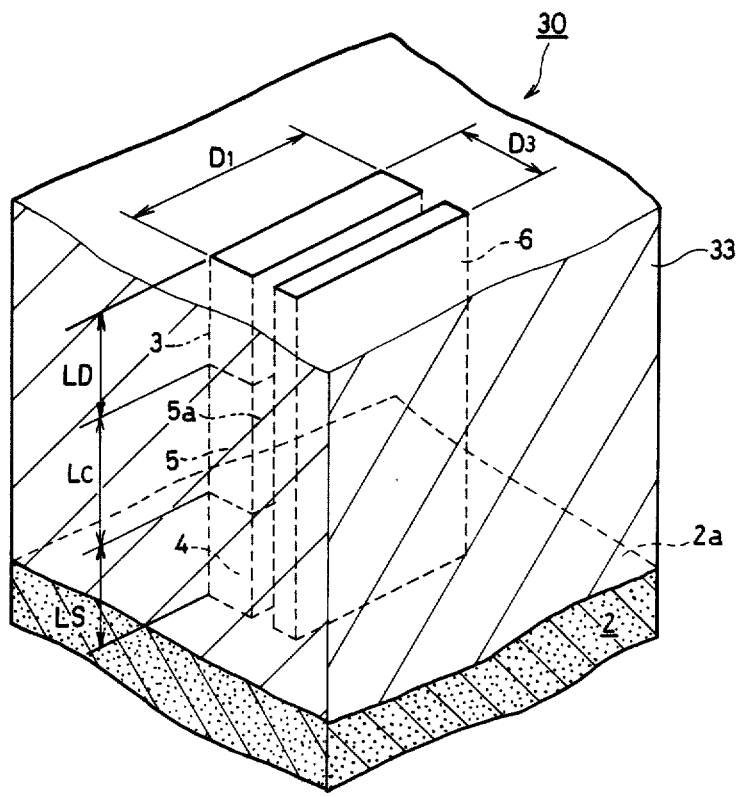
FIG. 4 is a schematic diagram showing a silicon gate type n channel MOSFET which is the second embodiment of the present invention.

FIG. 4 is a schematic diagram showing a silicon gate type n channel MOSFET, which is the second embodiment of the present invention.

Referring to FIG. 4, the MOSFET 30 is formed in the silicon oxide film 33 which is deposited on the main surface 2a of the substrate 2. This MOSFET 30 is different from the first embodiment in that the direction of the channel length $L_C$ of the channel surface 5a is vertical to the main surface 2a of the substrate 2. That is, the drain 3, the channel region 5 and the source 4 are stacked in the direction vertical to the main surface 2a in this embodiment.

The gate 6 extends in the direction vertical to the main surface 2a (in the depth direction). Different from the first embodiment, the gate 6 extends to the positions opposed to the drain 3 and the source 4.

The manufacturing method of the above MOSFET 30 will be described in the following with reference to FIGS. 5A to 5E.

Figure 5A:
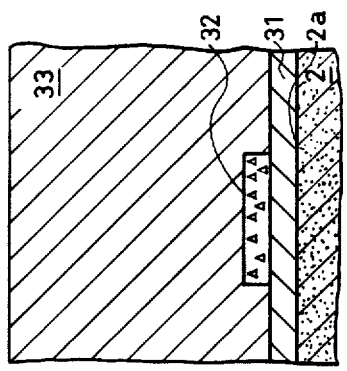
FIGS. 5A to 5E are cross sectional views showing the manufacturing process of the MOSFET shown in FIG. 4.

First, as shown in the cross sectional view of FIG. 5A, a silicon oxide film 31 is formed on the main surface 2a of the substrate 2 by thermal oxidation. A metal film 32 of high melting point is vapor deposited on the film 31 and patterned in a prescribed pattern. The patterned metal film 32 is to form an electrode of the source 4 as will be described later. A silicon oxide film 33 having the thickness of about several μm is deposited on the film 31 by the CVD method.

Figure 5B:
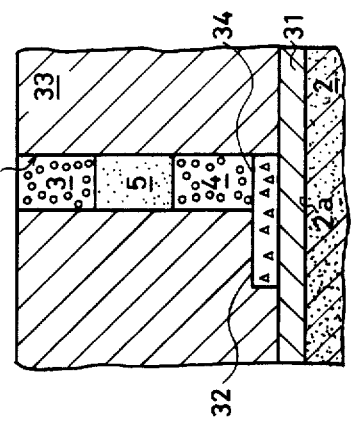

Thereafter, as shown in FIGS. 5B, a trench 35 which reaches the end portion 34 of the metal film 32 is formed with a resist (not shown) used as a mask. Three layers of doped silicon comprising arsenic, boron and arsenic in this order as dopants are formed in the trench 35. As a result, the source 4 is at the bottom, the channel region 5 is thereon and the drain 3 at the top.

Figure 5C:
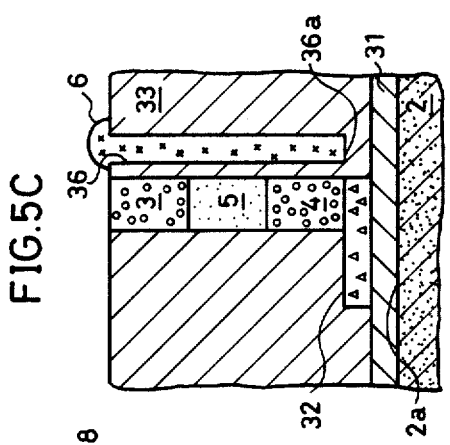
Figure 5D:
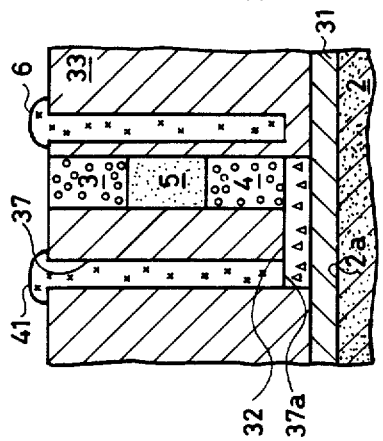

After the three-layer structure of the drain 3, the channel region 5 and the source 4 are formed, a trench 36 is formed near the three-layer structure by dry etching so that the bottom surface 36a of the trench 36 reaches down at least to the level of the upper end of the source 4. The trench 36 is filled with a doped polysilicon as the gate 6 by the CVD method (FIGS. 5C). In addition, a trench 37 is formed in the substrate so that the three-layer structure is disposed between the trenches 36 and 37 with a prescribed distance from the trench 37. As the trench 37 is formed, the metal film 32 is exposed at the bottom surface 37a of the trench 37. The doped polysilicon is filled in the trench 37 as same as in the trench 36 (FIGS. 5D). The doped polysilicon in the trench 37 is in contact with the metal film 32, thereby forming an electrode 41 of the source 4.

Figure 5E:
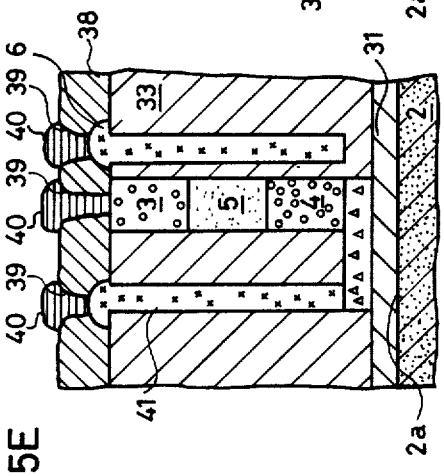

A silicon oxide film 38 is formed on the film 33, contact holes 39 are respectively provided for the drain 3, the source 4 and the gate 6, and Al wirings 40 are provided (FIGS. 5E). In addition, a protecting film (not shown) is applied thereon. Since the MOSFET 30 is formed in the silicon oxide film 33, there is no need of forming a region for isolating elements.

By the above described manufacturing method, the MOSFET 30 shown in FIG. 4 can be obtained.

The area $S_3$ in a plane parallel to the main surface of the substrate 2, required for forming the MOSFET 30 can be approximately calculated by $$S_3 = D_1 \times D_3 \tag{3}$$

where $D_1$ is a length of the drain or the gate in that plane and $D_3$ is the width of the gate 6 and the channel region 5 together in a direction normal to $D_1$ (FIG. 4).

As is apparent from the equation (3), the lengths $L_D$ of the drain 3 $L_S$ of the source 4 and the channel length $L_C$ (all in a direction normal to the main surface 2a of substrate 2) has no relation with the area $S_3$ in this MOSFET 30. Since the width $D_3$ is considerably smaller than length ($L_C + L_D + L_S$), the area $S_3$ on the main surface 2a of the substrate 2 occupied by the MOSFET 30 is smaller than that of the conventional MOSFET 1 (FIG. 1) and it is even smaller than that of the first embodiment.

Embodiment 3

Figure 6:
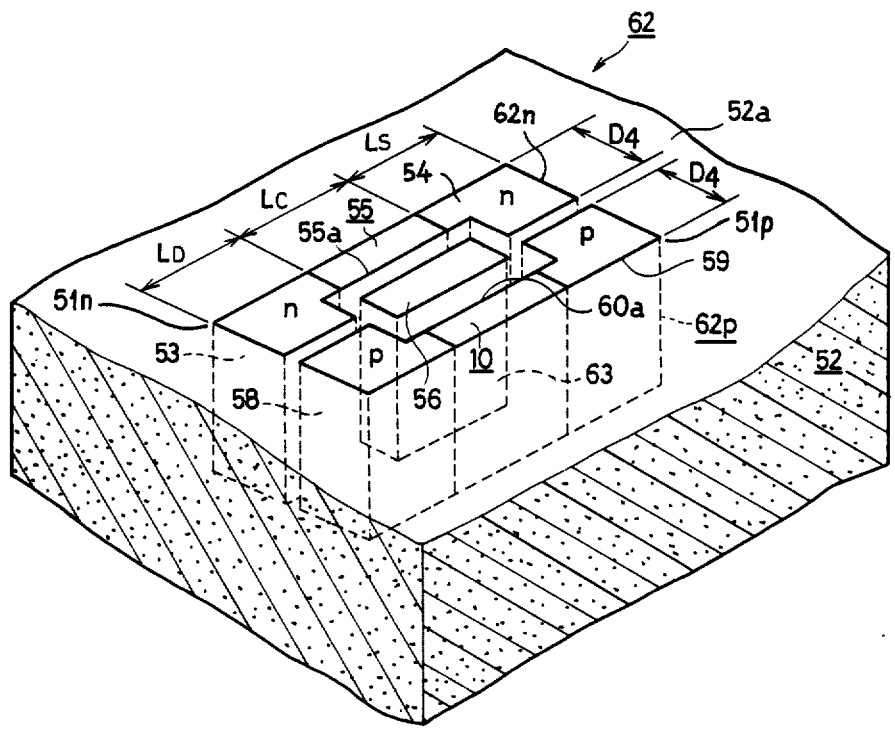
FIG. 6 is a schematic diagram showing a cMOSFET which is the third embodiment of the present invention.

In this embodiment, the present invention is applied to a complementary transistor. FIG. 6 shows a silicon gate type complementary MOS (cMOS) FET.

Referring to FIG. 6, the cMOSFET 51 has an nMOSFET 51n and a pMOSFET 51p. In the nMOSFET 51n, n type impurities are diffused in the p type silicon substrate 52 to form a drain 53 and a source 54. A channel region 55 is placed between the drain 53 and the source 54. A gate 56 formed of polysilicon is provided on the side of the channel region 55 with a gate oxide film, not shown, interposed therebetween. Meanwhile, in the pMOSFET 51p, a drain 58, a source 59 and a gate 60 therebetween are formed by forming an n-well layer 57 in the p type silicon substrate 52 and then diffusing p type impurities in the n-well layer 57. As a result, the channel region 60 is opposed to the gate 56 with a gate oxide film, not shown, interposed therebetween. The gate 56 is commonly used by the nMOSFET 51n and the pMOSFET 51p. Other oxide films and Al wirings are omitted in FIG. 6.

The cMOSFET 51 illustrated in FIG. 6 is different from the conventional cMOSFET in the following respects. The channel surfaces 55a and 60a defining the width of the flow path of carriers in the channel regions 55 and 60 of the transistors 51n and 51p are parallel to each other. The channel surfaces 55a and 60a are formed vertical to the main surface 52a of the substrate 52. The gate 56 extends in the direction vertical to the main surface 52a and is commonly used in the n channel transistor 62n and the p channel transistor 62p. In addition, the drains 53 and 58 and sources 54 and 59 are also formed vertical to the main surface 52a, extending in the depth direction of the substrate 52.

The area S₄ required for forming the cMOSFET 62 can be approximately calculated by $$S_4 = 2(L_C + L_D + L_S) \times D_4 \qquad (4)$$

where D₄ is the width of the sources 54, 59 and the drains 53, 58 on the main surface 52a. The width D₄ in the equation (4) is considerably smaller than the channel width D₁ of the equation (1). See FIG. 1 for a better appreciation of this benefit. Therefore, the area S₄ of the main surface 52a occupied by the cMOSFET 51 on the underlying substrate is considerably smaller than that required for a conventional complementary cMOS-FET.

In the cMOSFET 51, a current flows between the drains 53, 58 and the sources 54, 59 through an inverted layer (not shown) produced in the channel regions 55 and 60 by a voltage applied between the gate 56 and the sources 54, 59. The current depends on the magnitude of the voltage applied between the gate 56 and the sources 54, 59.

FIGS. 7A to 7J are plan views and cross sectional views showing the manufacturing process of the cMOSFET 51. The manufacturing process will be described in the following with reference to the figures.

Figure 7D:
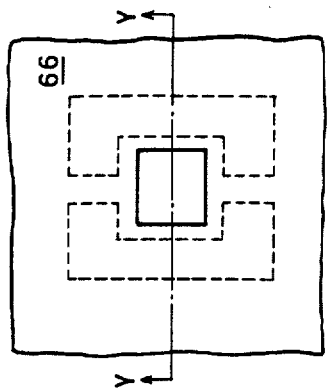
FIGS. 7Aa to 7Ja are plan views showing the manufacturing process of the cMOSFET shown in FIG. 6.
Figure 7E:
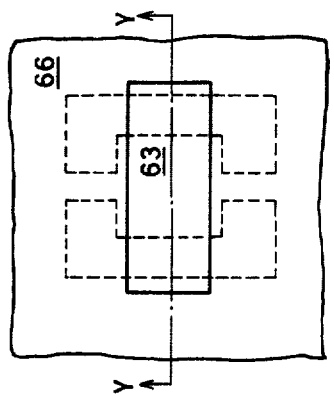
Figure 7F:
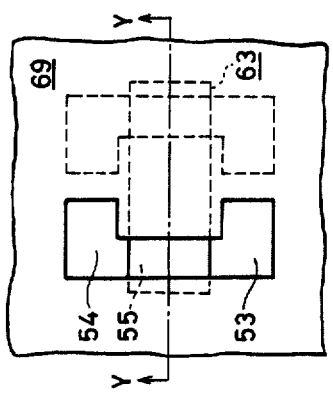
Figure 7D:
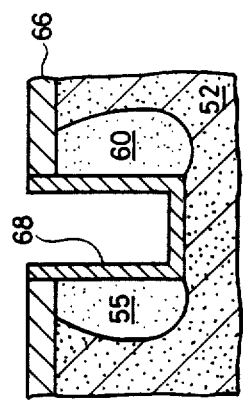
Figure 7E:
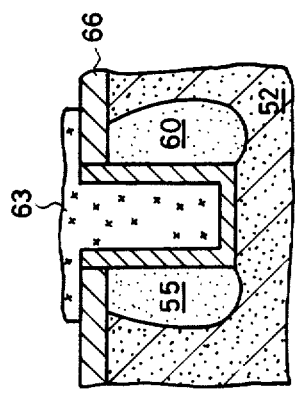
Figure 7F:
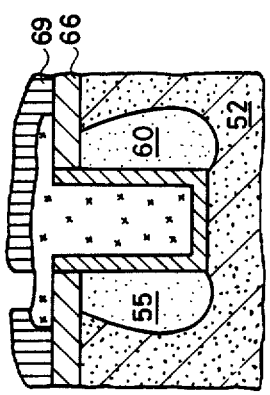
Figure 7A:
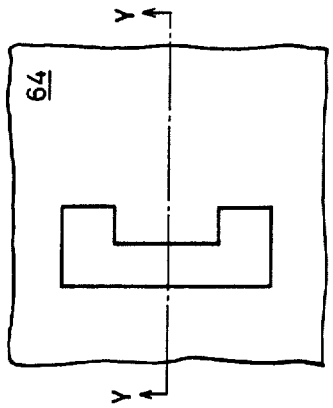
Figure 7B:
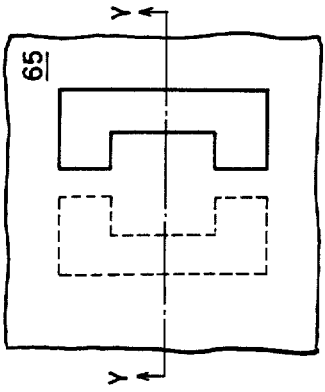

First, as shown in FIGS. 7A, boron is implanted in a portion of the p type substrate 52 in which the drain 53, the source 54 and the channel region 55 of the nMOSFET 51n are to be formed, using a resist 64 applied on the substrate 52 as a mask. After the resist 64 is removed, a resist 65 is applied as shown in FIGS. 7B. After that, using the resist 65 as a mask, phosphorus is implanted in a portion of the substrate 52 in which the drain 58, the source 59 and the channel region 60 of the pMOSFET 51p should be formed. The implantation of boron or phosphorus is carried out by a know stepup implantation technique.

Figure 7C:
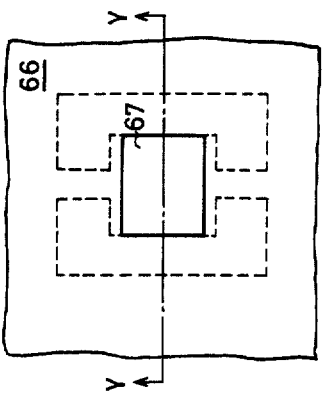
Figure 7A:
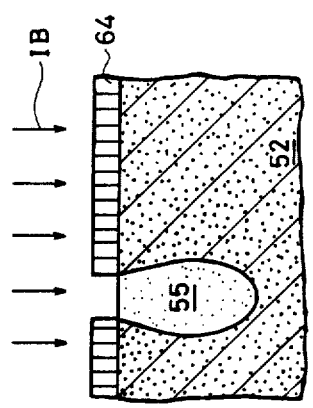
Figure 7B:
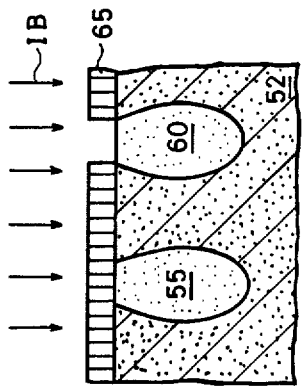
Figure 7C:
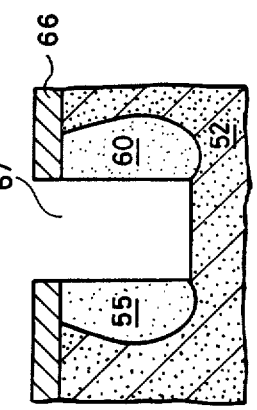

After the resist 65 is removed, a silicon oxide film 66 is formed on the upper surface of the substrate 52, and selective etching is carried out on a portion in which the gate 56 is to be formed, to form a trench 67 (FIGS. 7C). On this occasion, the position of the trench 67 is determined such that the trench 67 bares the channel regions 55 and 60. After the trench 67 is formed, a silicon oxide film 68 is formed on the inner surface of the trench 67 (FIGS. 7D). A portion of the silicon oxide film 68 which is formed on the side of the channel regions 55 and 60 will be the gate oxide film of the cMOSFET 51.

Thereafter, as shown in FIGS. 7E, a doped polysilicon is deposited on the upper surface of the substrate 52 (including the inside of the trench 67) by the CVD method and selective patterning is carried out by lithography to form the gate 56. As a result, the gate 56 is formed on the silicon oxide film 66 and covers the channel regions 55 and 60.

Figure 7G:
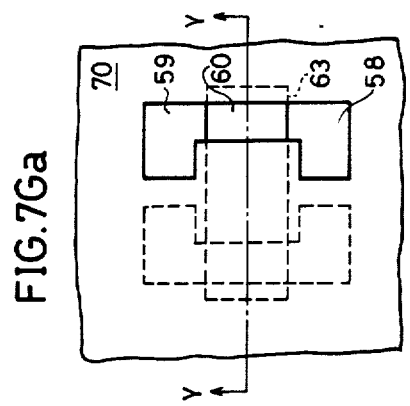
Figure 7G:
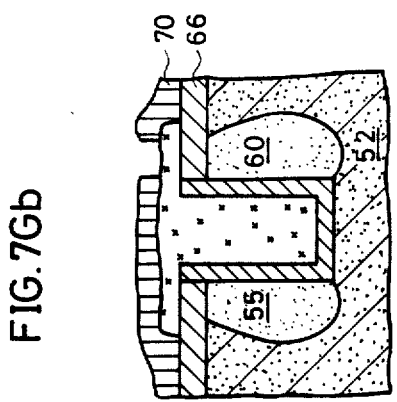

Thereafter, a resist 69 is applied and stepup implantation of phosphorus is carried out in a portion of the substrate 52 in which the drain 53 and the source 54 of the nMOSFET 51n should be formed by self-alignment with the resist 69 and the gate 56 serving as masks (FIGS. 7F). Thereafter, the resist 69 is removed and a resist 70 is applied (FIGS. 7G). Thereafter, the stepup implantation of boron is carried out in portions of the substrate 52 in which the drain 58 and the source 59 of the pMOSFET 62p is formed by self-alignment using the resist 70 and the gate 56 serving as masks. Since the drains 53, 58 and the sources 54, 59 are formed by self-alignment using the resists 69 and 70 and the gate 56 as masks, the positions of the drains 53, 58 and the sources 54, 59 in relation to the channel regions 55 and 60 are not deviated due to the deviation of the masks or the resists 69 and 70. Therefore, the electrical characteristics of the cMOSFET 51 will not be degraded even if it is implemented in higher integration.

In this embodiment, the drains 53 and 58 and the sources 54 and 59 must be formed in relatively deep positions. Therefore, the extension of the implanted phosphorus and boron in the transverse direction (especially in the direction of the channel regions 55 and 60) must be controlled so as not to damage the electrical characteristics of the cMOSFET 51. The control can be carried out by the stepup implantation in consideration of the relation of the extension of phosphorus and boron in the transverse direction, and the depth of implantation to the stepup voltage of ion beams of phosphorus and boron is experimentally studied beforehand.

Figure 7H:
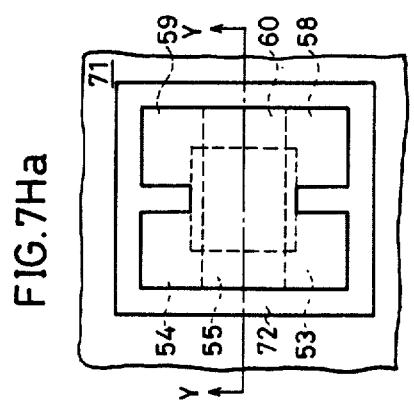
Figure 7H:
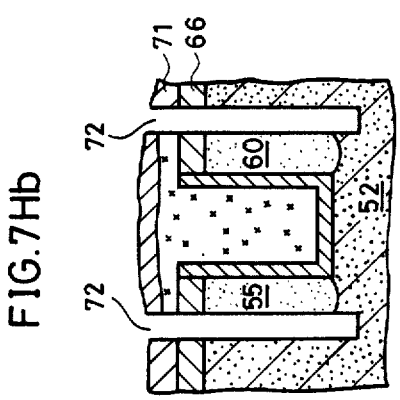
Figure 7I:
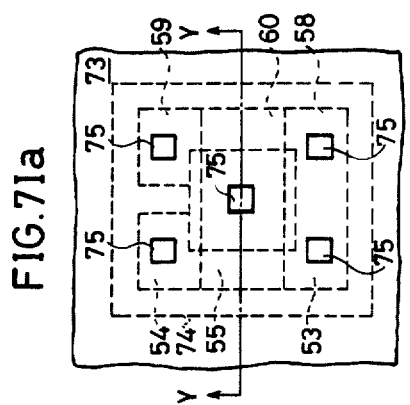
Figure 7I:
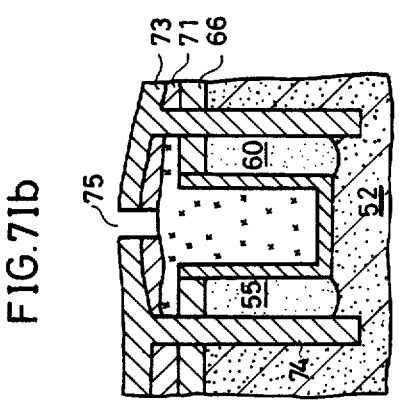
Figure 7J:
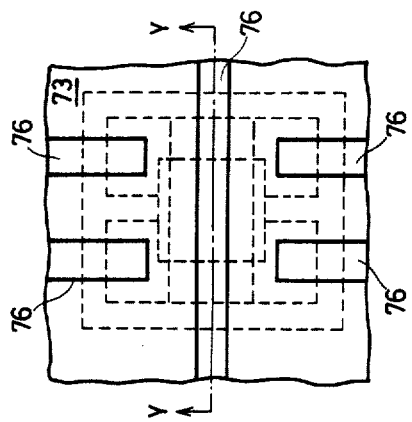
Figure 7J:
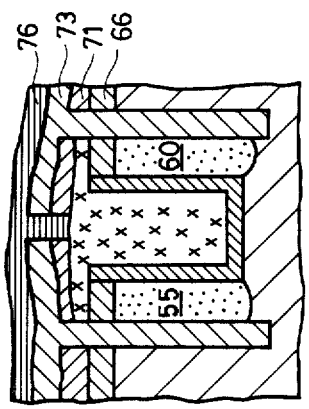

Thereafter, the resist 70 is removed, a silicon oxide film 71 is formed, and selective etching is carried out around the drains 53, 58, sources 54, 59 and the channel regions 55, 60 to form a trench 72 for separating elements (FIGS. 7Ha and 7Hb). Thereafter, a silicon oxide film 73 is formed on the upper surface of the film 71 by thermal oxidation or the CVD method (FIGS. 7Ia and 7Ib). Besides, the silicon oxide film 73 is also formed in the trench 72 to form the separating region 74. Thereafter, contact holes 75 are provided above the drains 53, 58, sources 54, 59 and the gate 56, respectively, by lithography.

Aluminum wirings 76 are provided in each of the contact holes 75 (FIGS. 7Ja and 7Jb) and a protecting film (not shown) is applied thereon.

By the above described manufacturing method, a cMOSFET 51 as shown in FIG. 6 is provided.

Other Embodiments

Although description has been provided of the silicon gate type n channel MOSFET in the first and second embodiments, it is not limited to this and the present invention can be applied to FETs in general, such as p channel MOSFET, a junction type FET and the like.

In the third embodiment, the example is shown in which one gate 56 is commonly used by two FETs, that is, the pMOSFET 51p and the nMOSFET 51n. The gate may be commonly used by three or more FETs.

Figure 8A:
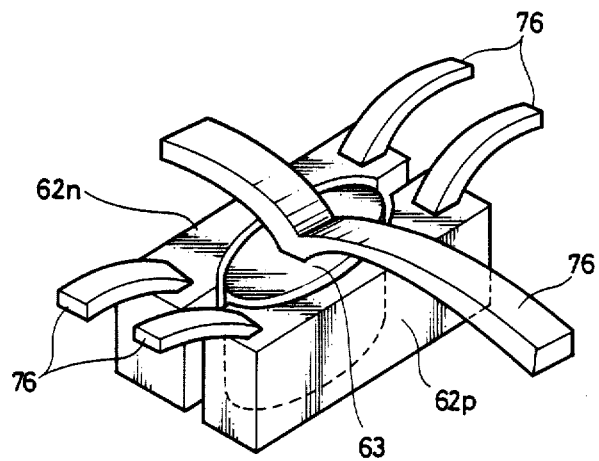
FIG. 8A is a perspective view showing a cMOSFET which is the fourth embodiment of the present invention.
Figure 8B:
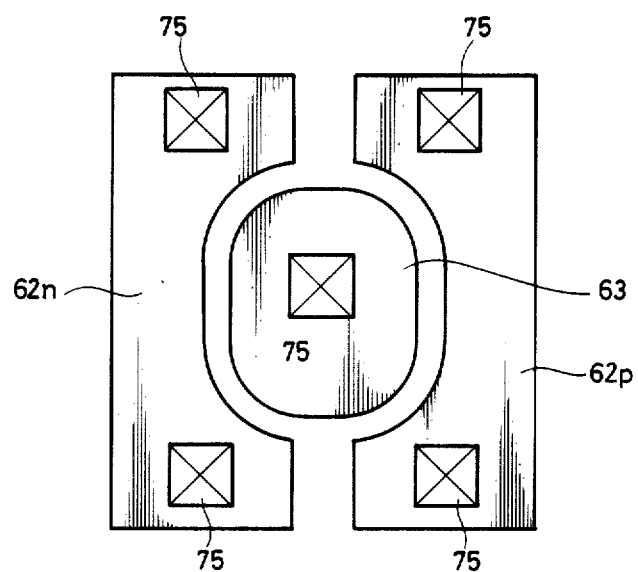
FIG. 8B is a partial plan view thereof.

Although the gate 56 and the vicinity thereof are rectangular in the third embodiment, those portions may be rounded as shown in the perspective view of FIG. 8A or in the plan view of FIG. 8B.

As described above, according to the channel region and the gate formed vertical to the main surface of the substrate, the proportion of the area occupied by one field effect transistor to the whole main surface can be reduced, and a highly integrated field effect transistor can be provided without making compact the field effect transistor itself.

Although preferred embodiments of the present invention have been described and illustrated in detail, it should be clearly understood that the same is by way of illustration and example only and is not to be taken by way of limitation, the spirit and scope of the present invention being limited only by the terms of the appended claims.

What is claimed is:

1. A complementary field effect transistor, comprising:
   a semiconductor substrate having a main surface;
   a n-channel transistor formed in said semiconductor substrate; and
   a p-channel transistor formed in said semiconductor substrate and arranged opposed to said n-channel transistor, each of said transistors comprising a pair of source-drain regions, a channel region arranged therebetween, and a gate region arranged opposed to and spaced apart from the channel region, wherein
   each of said channel regions has a channel surface defining a width of a flow path of carriers, said channel surfaces being approximately parallel to each other and formed to be disposed approximately vertical to said main surface of said substrate, and
   said gate region is arranged between said both transistors and formed to extend approximately vertical to the main surface into said substrate.

2. A field effect transistor according to claim 1, wherein:
   said gate region is commonly used for both transistors.

3. A field effect transistor according to claim 2, wherein:
   said source-drains regions are arranged on opposite sides of said channel region and formed to extend approximately vertical to the main surface into said substrate.

4. A complementary field effect transistor having an n-channel transistor and a p-channel transistor, comprising:
   a substrate having a main surface and a trench formed to extend from the main surface into the substrate in a depth direction, said trench having a pair of opposing first sidewalls and a pair of opposing second sidewalls adjacent to said pair of first sidewalls;
   a p-type semiconductor region serving as a channel region of said n-channel transistor, formed to be exposed on said surface of said substrate and on one sidewall of said pair of first sidewalls of said trench;
   n-type source/drain regions of said n-channel transistor formed exposed on each of said pair of second sidewalls of said trench, and disposed adjacent to both sides of said p-type semiconductor region on the side on which said trench is not formed in said semiconductor substrate and on said main surface;
   an n-type semiconductor region serving as a channel region of said p-channel transistor, formed to be exposed on the other sidewall of said pair of first sidewalls and on said main surface of said substrate;
   p-type source/drain regions of said p-channel transistor, formed exposed on each of said pair of second sidewalls of said trench adjacent to both sides of said n-type semiconductor region on a side on which said trench is not formed in said semiconductor substrate and on said main surface; and
   a gate electrode, for serving both the n-channel transistor and the p-channel transistor, formed opposing to said exposed p-type semiconductor region with a first gate insulator interposed therebetween and opposing to said exposed n-type semiconductor region with a second gate insulator interposed therebetween in said trench.

5. A highly integrated field effect transistor, comprising:
   a semiconductor p-type substrate having a main surface;
   a trench formed in said substrate vertical to said main surface thereof, said trench comprising a channel region occupying a central portion of the trench to a length $L_C$ and a pair of source/drain regions respectively formed on opposite sides of the channel region within the trench so as to extend to respective lengths $L_S$ and $L_D$ collinearly with $L_C$ and to a width $D_2$ normal thereto, whereby an area of the main surface $(L_S+L_C+L_D) \times D_2$ corresponds to the transistor at the main surface; and
   a gate region formed opposed to said channel region in said substrate so that it is included within the width $D_2$, $D_2$ being smaller than $D_1$ which is a common depth into the substrate of the channel region, the drain/source region and said gate region, wherein said gate region contains a doped polysilicon surrounded by a silicon oxide film and electrical connections are provided for connecting said transistor at said source, drain, and gate regions thereof to an external circuit.

6. A highly-integrated field effect transistor, comprising:
   a semiconductor substrate;
   a first silicon oxide film on said substrate;
   a metal film formed on a portion of said first silicon oxide film;
   a second silicon oxide film formed to a predetermined thickness over said metal film and said first silicon oxide film beyond the metal film;
   a trench formed to extend a length thereof across the thickness of said second silicon oxide film vertically from an exposed surface thereof to said metal film;
   a doped silicon layer comprising three successive portions doped with arsenic, boron and arsenic respectively, disposed in that order in said trench along said length thereof from said exposed surface of said second silicon oxide film to said metal film, to provide corresponding source and drain regions separated by a channel region;
   a doped silicon gate disposed adjacent to said trench containing said source, channel and drain regions; and
   an electrode communicating with said metal film through said second silicon oxide film.

7. A highly integrated field effect transistor, comprising:
   a p-type silicon substrate having a main surface having a portion implanted with boron and a first trench formed to a side of said boron implanted portion to expose the same;
   a silicon oxide film lining said trench at least to cover said exposed boron implanted position and to cover said main substrate surface;
   doped polysilicon filled within said silicon oxide film lining said first trench to serve as a gate for said transistor, said gate being disposed across said silicon oxide film opposite said boron implanted portion that cooperates with said gate as a channel for carriers;
   a quantity of arsenic controllably implanted by stepup implementation into said substrate on opposite sides of said channel and contiguously therewith to serve as respective source/drain regions of said transistor;

a second trench filled with silicon oxide and surrounding said source, channel and drain regions to form an isolating region for said transistor; and electrical contact means for connecting said source and drain regions and said gate to an external circuit.

8. A complementary field effect transistor having an n-channel transistor and a p-channel transistor, comprising:

a p-type semiconductor substrate having a major surface and in which, by stepup implantation, boron is implanted in a first position where said a first source, a first channel region and a first drain contiguous in this order are formed for said n-channel transistor and phosphorous is implanted in a second position (adjacent said first portion) where a second source, a second channel region and a second drain contiguous in this order are formed for said p-channel transistor;

a silicon oxide lined trench formed between the first and second channel regions to serve as a gate oxide film, a space within said silicon oxide lining being filled with a doped polysilicon to serve as a common gate for said n-channel and p-channel transistors;

a silicon oxide film disposed to substantially cover said first and second sources, channel regions, gate and source regions and to surround the same peripherally into said substrate to isolate the same; and electrical contact means for connecting an external circuit to said first and second sources, gate and first and second drains.

9. A complementary field effect transistor according to claim 8, wherein:

said gate has a rounded outer boundary surface and said first and second source, channel and drain regions are correspondingly rounded adjacent thereto.

10. A complementary field effect transistor according to claim 9, wherein:

said film isolating the complementary field effect transistor has a generally cubical outer form and is proportioned and disposed such that the area occupied thereby at the substrate main surface is at a minimum.

* * * * *